United States Patent
Cheng et al.

(10) Patent No.: US 10,090,431 B2
(45) Date of Patent: Oct. 2, 2018

(54) SYSTEM AND METHOD FOR THIN FILM PHOTOVOLTAIC MODULES AND BACK CONTACT FOR THIN SOLAR CELLS

(71) Applicant: New Jersey Institute of Technology, Newark, NJ (US)

(72) Inventors: Zimeng Cheng, Kearny, NJ (US); Ken K. Chin, Pine Brook, NJ (US); Alan E. Delahoy, Rocky Hill, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 343 days.

(21) Appl. No.: 14/774,421

(22) PCT Filed: Mar. 12, 2014

(86) PCT No.: PCT/US2014/024862
§ 371 (c)(1),
(2) Date: Sep. 10, 2015

(87) PCT Pub. No.: WO2014/165225
PCT Pub. Date: Oct. 9, 2014

(65) Prior Publication Data
US 2016/0027954 A1    Jan. 28, 2016

Related U.S. Application Data

(60) Provisional application No. 61/777,784, filed on Mar. 12, 2013, provisional application No. 61/777,735, filed on Mar. 12, 2013.

(51) Int. Cl.
*H01L 21/00* (2006.01)
*H01L 31/18* (2006.01)
(Continued)

(52) U.S. Cl.
CPC ...... *H01L 31/1884* (2013.01); *H01L 31/0296* (2013.01); *H01L 31/02245* (2013.01);
(Continued)

(58) Field of Classification Search
CPC ....... H01L 31/02245; H01L 31/022466; H01L 31/0296; H01L 31/18; H01L 31/1884; Y02E 10/50
(Continued)

(56) References Cited

U.S. PATENT DOCUMENTS 4,849,029 A   7/1989   Delahoy
7,771,571 B2  8/2010   Laird et al.
(Continued)

FOREIGN PATENT DOCUMENTS

WO    2011/123117    10/2011

OTHER PUBLICATIONS

Delahoy et al., Reactive-environment, hollow cathode sputtering: Basic characteristics and application to Al2O3, doped ZnO and In2O3:Mo, Published by the American Vacuum Society, published Jul. 22, 2004.*
(Continued)

*Primary Examiner* — Duy T Nguyen
(74) *Attorney, Agent, or Firm* — McCarter & English, LLP

(57) ABSTRACT

The present disclosure provides improved thin film photovoltaic devices and related methods of fabrication. More particularly, the present disclosure provides improved CdTe photovoltaic devices and related fabrication methods. Disclosed is a novel thin film photovoltaic device and means for its fabrication. An exemplary device includes a metal oxide layer between the absorber layer and the rear electrode, resulting in an ohmic back contact and having improved device stability. The metal oxide layer can include at least one of silver oxide or copper oxide, and may additionally
(Continued)

contain nickel oxide, molybdenum oxide, and/or vanadium oxide. The present disclosure is directed towards formation of a ohmic back contact for solar cells, the back contact having improved stability. In certain embodiments, the present disclosure provides for an ohmic contact to p-type II-VI semiconductors, and to the fabrication of solar cells having improved stability, and to solar panels incorporating such back contact schemes.

11 Claims, 5 Drawing Sheets

(51) Int. Cl.
*H01L 31/0224* (2006.01)
*H01L 31/0296* (2006.01)

(52) U.S. Cl.
CPC ...... *H01L 31/022466* (2013.01); *H01L 31/18* (2013.01); *Y02E 10/50* (2013.01)

(58) Field of Classification Search
USPC .......................................... 438/57
See application file for complete search history.

(56) References Cited

U.S. PATENT DOCUMENTS

| 7,858,872 | B2 | 12/2010 | Hotz et al. |
| 9,054,256 | B2 | 6/2015 | Fu et al. |
| 9,240,502 | B2 | 1/2016 | Adachi et al. |
| 2008/0128517 | A1* | 6/2008 | Yukawa ............. G11C 13/0016 235/492 |
| 2008/0149179 | A1 | 6/2008 | Romeo et al. |
| 2008/0308411 | A1 | 12/2008 | Guo et al. |
| 2009/0027668 | A1* | 1/2009 | Fujimaki ................ G01N 21/65 356/301 |
| 2009/0078318 | A1 | 3/2009 | Meyers et al. |
| 2009/0242018 | A1 | 10/2009 | Ahn et al. |
| 2011/0240123 | A1* | 10/2011 | Lin ..................... H01L 31/0296 136/260 |
| 2013/0056054 | A1* | 3/2013 | Liang .............. H01L 31/022441 136/256 |

OTHER PUBLICATIONS

Delahoy, A.E., Recent Developments in Amorphous Silicon Photovoltaic Research and Manufacturing at Chronar Corporation, Solar Cells 27, 39 (1989).
International Search Report and Written Opinion for PCT/US2014/024862 dated Aug. 27, 2014.
PCT/US2014/024862, Mar. 12, 2014, WO 2014/165225.
U.S. Appl. No. 61/777,784, filed Mar. 12, 2013.
U.S. Appl. No. 61/777,735, filed Mar. 12, 2013.

* cited by examiner

SYSTEM AND METHOD FOR THIN FILM PHOTOVOLTAIC MODULES AND BACK CONTACT FOR THIN SOLAR CELLS

CROSS-REFERENCE TO RELATED APPLICATIONS

This application claims the benefit of: (i) U.S. Provisional Application Ser. No. 61/777,735 filed Mar. 12, 2013, and (ii) U.S. Provisional Application Ser. No. 61/777,784 filed Mar. 12, 2013, the contents of each being herein incorporated by reference in their entireties.

FIELD OF THE DISCLOSURE

The present disclosure relates to improved thin film photovoltaic devices or modules and related methods of fabrication and, more particularly, to improved CdTe photovoltaic devices or modules and related methods of fabrication.

BACKGROUND OF THE DISCLOSURE

In general, solar cells and photovoltaic modules based on II-VI semiconductors (e.g., CdTe) are known and exist as commercial products. However, the formation of a stable, ohmic contact to the active semiconductor has historically presented difficulties. It is noted that some non-ideal solutions to these problems exist, and such solutions have, to a greater or lesser degree, drawbacks and deficiencies. Metals are often used as ohmic contact materials for semiconductors. In general, the contact barrier height $\varphi_b$ on a p-type semiconductor is given by the equation:

$$\varphi_b = \frac{E_g}{q} + (\chi - \varphi_m)$$

where $E_g$ is the bandgap of the semiconductor, $\chi$ is its electron affinity, and $\varphi_m$ is the work function of the metal.

In general, in order for a metal to form an ohmic contact with CdTe, and not a Schottky barrier, its work function should be equal to or greater than the sum of the electron affinity and the band gap of CdTe. CdTe has a high electron affinity (e.g., 4.4 eV) and a relatively large bandgap (e.g., 1.5 ev). If a low barrier is allowed at this interface, then the metal work function is typically required to be 5.7 eV or greater. No metals generally exist having such a large work function. For example, Au has one of the largest metal work functions (e.g., 5.1 eV). For comparison, examples of low work function metals are Cs (e.g., 2.1 eV), and Cd (e.g, 4.1 eV). A rear Schottky barrier on the CdTe having a barrier height greater than 0.3 eV will limit the current at high forward bias at room temperature. Therefore, pseudo-ohmic contacts are typically used in which the p-type CdTe is converted to p$^+$ CdTe. The resulting narrow barrier can then be penetrated by tunneling.

Alternatively, a buffer layer (e.g., p$^+$-ZnTe, $Sb_2Te_3$, $As_2Te_3$) can be inserted between the CdTe and the metal. It has been found that most back contact formulations create a Te-rich surface layer of the CdTe. Frequently, this reacts with the metal to form a telluride compound. Preparation of the CdTe surface prior to metal deposition frequently involves chemical etching to both remove surface oxides and to form a Cd-depleted (Te-rich) surface. Several formulations can be found in the literature.

Most formulations utilize a small quantity of Cu. For example, a 5 nm layer of Cu can be deposited, or a Au—Cu alloy can be used, or Cu-doped graphite or graphite paste. If a Cu layer is used, it is subsequently annealed at about 200 to 250° C. The Cu forms a $Cu_{2-x}Te$ compound at the surface. In addition some elemental Cu diffuses into the CdTe to contribute to p-type doping. Cu can result in competing effects: an improved contact and reduced series resistance, but also increased shunting and reduced shunt resistance. The use of excessive Cu has also been associated with solar cell instability and performance degradation over time and under conditions of stress. Excess Cu is usually associated with Cu accumulation in the CdS layer leading to compensation, high resistivity and noticeable photoconductivity. The choice of back metal (or rear metal electrode) is also important. Au, Al, or Ni can lead to device instability while Mo usually does not. Other possibilities include Cr or Ag paste.

Moreover, an alternative concept to the conventional three-scribe process for forming interconnected thin-film photovoltaic (PV) module structures has been described in the prior art. The concept involves patterning operations performed on the basic solar cell structure, the deposition of an insulator over the rear of the solar cell structure, and the subsequent deposition of a further conductive layer.

Thus, an interest exists for improved thin film photovoltaic devices/modules and related methods of fabrication. These and other inefficiencies and opportunities for improvement are addressed and/or overcome by the assemblies, systems and methods of the present disclosure.

SUMMARY OF THE DISCLOSURE

The present disclosure provides advantageous thin film photovoltaic devices/modules and related methods of fabrication. More particularly, the present disclosure provides improved CdTe photovoltaic devices/modules and related methods of fabrication.

In certain embodiments, disclosed is a novel thin film photovoltaic device and means for its fabrication. In exemplary embodiments, the device includes a metal oxide layer between the absorber layer and the rear electrode, resulting in an ohmic back contact and having improved device stability. In some embodiments, the metal oxide layer includes at least one of silver oxide or copper oxide, and may additionally contain one or more of nickel oxide, molybdenum oxide, and/or vanadium oxide.

In exemplary embodiments, the present disclosure is directed towards formation of a ohmic back contact for solar cells, the back contact having improved stability. In certain embodiments, the present disclosure provides for an ohmic contact to p-type II-VI semiconductors (e.g., CdTe semiconductors), and to the fabrication of solar cells having improved stability, and to solar panels incorporating such back contact schemes.

The present disclosure provides for a photovoltaic device including a transparent substrate; a transparent conductor layer positioned on the transparent substrate; a window layer positioned on the transparent conductor layer; an absorber layer positioned on the window layer, the absorber layer including a Group II-VI semiconductor; a doping layer positioned on the absorber layer, the doping layer including at least one of silver oxide or copper oxide; a contact layer positioned on the doping layer, the contact layer: (i) including one or more metal oxides, and (ii) forming an ohmic contact with the absorber layer; and a metal layer positioned on the contact layer.

The present disclosure also provides for a photovoltaic device wherein the transparent conductor layer includes a material system selected from the group consisting of a degenerately doped metal oxide, a degenerately doped metal oxide overcoated with a high resistance layer, and a silver nanowire net.

The present disclosure also provides for a photovoltaic device wherein the absorber layer includes a CdTe semiconductor. The present disclosure also provides for a photovoltaic device wherein the window layer includes a CdS semiconductor. The present disclosure also provides for a photovoltaic device wherein the doping layer is substantially diffused into the absorber layer. The present disclosure also provides for a photovoltaic device wherein the contact layer includes at least one of silver oxide or copper oxide.

The present disclosure also provides for a photovoltaic device wherein the contact layer includes one or more oxides selected from the group consisting of silver oxide, copper oxide, nickel oxide, molybdenum oxide and vanadium oxide. The present disclosure also provides for a photovoltaic device wherein the wherein the contact layer includes one or more oxides selected from the group consisting of $Ag_2O$, $CuO$, $NiO$, $MoO_3$ and $V_2O_5$.

The present disclosure also provides for a photovoltaic device wherein the contact layer includes silver oxide; and wherein the silver oxide is deposited to the contact layer by a deposition technique selected from the group consisting of: (i) supplying silver in the presence of an active form of oxygen, (ii) by the reactive sputtering of silver, and (iii) by radio frequency (RF) sputtering of silver oxide.

The present disclosure also provides for a photovoltaic device wherein the contact layer includes silver oxide; wherein the silver oxide is deposited to the contact layer by supplying silver in the presence of an active form of oxygen; and wherein the active form of oxygen is produced by a plasma containing oxygen or containing oxygen and one or more other gases.

The present disclosure also provides for a photovoltaic device wherein the contact layer includes molybdenum oxide; and wherein the $MoO_3$ is deposited to the contact layer by a deposition technique selected from the group consisting of: (i) vacuum evaporation of $MoO_3$, (ii) reactive sputtering of Mo, or (iii) RF sputtering of molybdenum oxide. The present disclosure also provides for a photovoltaic device wherein the reactive sputtering of molybdenum is a sputtering technique selected from the group consisting of: (i) magnetron sputtering, (ii) hollow cathode sputtering, (iii) reactive environment hollow cathode sputtering (REHCS), or (iv) gas flow sputtering.

The present disclosure also provides for a photovoltaic device wherein the contact layer is formed by reactive environment hollow cathode sputtering. The present disclosure also provides for a photovoltaic device wherein the metal layer includes at least one of Ni, Ti, Mo or Al. The present disclosure also provides for a photovoltaic device wherein the metal layer includes one or more underlayers to improve adhesion or to prevent impurity diffusion from the metal layer.

The present disclosure also provides for a method for fabricating a photovoltaic device including providing a transparent substrate; positioning a transparent conductor layer on the transparent substrate; positioning a window layer on the transparent conductor layer; positioning an absorber layer on the window layer, the absorber layer including a Group II-VI semiconductor; positioning a doping layer on the absorber layer, the doping layer including at least one of silver oxide or copper oxide; positioning a contact layer on the doping layer, the contact layer: (i) including one or more metal oxides, and (ii) forming an ohmic contact with the absorber layer; and positioning a metal layer on the contact layer.

The present disclosure also provides for a method for fabricating a photovoltaic device wherein the transparent conductor layer includes a material system selected from the group consisting of a degenerately doped metal oxide, a degenerately doped metal oxide overcoated with a high resistance layer, and a silver nanowire net.

The present disclosure also provides for a method for fabricating a photovoltaic device wherein the absorber layer includes a CdTe semiconductor; wherein the window layer includes a CdS semiconductor; wherein the doping layer is substantially diffused into the absorber layer; and wherein the contact layer includes at least one of silver oxide or copper oxide.

The present disclosure also provides for a method for fabricating a photovoltaic device wherein the contact layer includes one or more oxides selected from the group consisting of silver oxide, copper oxide, nickel oxide, molybdenum oxide and vanadium oxide. The present disclosure also provides for a method for fabricating a photovoltaic device wherein the contact layer includes silver oxide; and wherein the silver oxide is deposited to the contact layer by a deposition technique selected from the group consisting of: (i) supplying silver in the presence of an active form of oxygen, (ii) by the reactive sputtering of silver, and (iii) by radio frequency (RF) sputtering of silver oxide.

The present disclosure also provides for a method for fabricating a photovoltaic device wherein the contact layer includes silver oxide; wherein the silver oxide is deposited to the contact layer by supplying silver in the presence of an active form of oxygen; and wherein the active form of oxygen is produced by a plasma containing oxygen or containing oxygen and one or more other gases.

The present disclosure also provides for a method for fabricating a photovoltaic device wherein the contact layer includes molybdenum oxide; and wherein the $MoO_3$ is deposited to the contact layer by a deposition technique selected from the group consisting of: (i) vacuum evaporation of $MoO_3$, (ii) reactive sputtering of Mo, or (iii) RF sputtering of molybdenum oxide.

The present disclosure also provides for a method for fabricating a photovoltaic device wherein the reactive sputtering of molybdenum is a sputtering technique selected from the group consisting of: (i) magnetron sputtering, (ii) hollow cathode sputtering, (iii) reactive environment hollow cathode sputtering (REHCS), or (iv) gas flow sputtering.

The present disclosure also provides for a method for fabricating a photovoltaic device wherein the contact layer is formed by reactive environment hollow cathode sputtering. The present disclosure also provides for a method for fabricating a photovoltaic device wherein the metal layer includes at least one of Ni, Ti, Mo or Al; and wherein the metal layer includes one or more underlayers to improve adhesion or to prevent impurity diffusion from the metal layer.

The present disclosure also provides for a method for fabricating a photovoltaic device including providing a substrate; positioning a first conductor layer on the substrate; positioning a window layer on the first conductor layer; positioning a semiconductor layer on the window layer; positioning a second conductor layer on the semiconductor layer; penetrating the second conductor layer, the semiconductor layer and the window layer via a first tunnel to expose at least a first portion of the first conductor layer; positioning a pin-hole free polymer film on the second conductor layer, thereby filling the first tunnel; penetrating the polymer film and at least a portion of the filled tunnel via a second tunnel to expose at least a second portion of the first conductor layer; and positioning a third conductor layer on the polymer film, thereby filling the second tunnel with the third conductor layer, and with the third conductor layer contacting the first conductor layer via the filled second tunnel so that the second and third conductor layers are then available to be accessed in order to utilize power generated by the photovoltaic device.

The present disclosure also provides for a method for fabricating a photovoltaic device wherein the step of penetrating the second conductor layer, the semiconductor layer and the window layer via a first tunnel to expose at least a first portion of the first conductor layer further includes: printing or adhering dots to the window layer and the semiconductor layer; positioning the second conductor layer on the semiconductor layer; and washing away or removing the dots, thereby penetrating the second conductor layer, the semiconductor layer and the window layer via a first tunnel to expose at least a first portion of the first conductor layer.

The present disclosure also provides for a method for fabricating a photovoltaic device wherein the polymer film is in a pre-metallized state with a metal contact prior to being positioned on the second conductor layer. The present disclosure also provides for a method for fabricating a photovoltaic device wherein the polymer film is in a un-metallized state prior to being positioned on the second conductor layer, and is metallized after being positioned on the second conductor layer.

The present disclosure also provides for a method for fabricating a photovoltaic device including providing a substrate; positioning a first conductor layer on the substrate; positioning a window layer on the first conductor layer; positioning a semiconductor layer on the window layer; positioning a second conductor layer on the semiconductor layer; providing a cut passing through the first conductor layer, the window layer, the semiconductor layer and the second conductor layer; filling the cut with an insulating material; and positioning a third conductor layer above the second conductor layer so that the third conductor layer overlaps and contacts a second conductor layer of an adjacent unit cell but does not contact a third conductor layer of the adjacent unit cell.

The present disclosure also provides for a method for fabricating a photovoltaic device wherein prior to positioning the third conductor above the second conductor layer, a pin-hole free polymer film is positioned on at least a portion of the second conductor layer.

The present disclosure also provides for a photovoltaic device including a substrate; a first conductor layer positioned on the substrate; a window layer positioned on the first conductor layer; a semiconductor layer positioned on the window layer; a second conductor layer positioned on the semiconductor layer; a pin-hole free polymer film positioned on the second conductor layer; a third conductor layer positioned on the polymer film, the third conductor layer penetrating the polymer film, the second conductor layer, the semiconductor layer, and window layer to contact the first conductor layer but not contact the second conductor layer; wherein the second and third conductor layers are available to be accessed in order to utilize power generated by the photovoltaic device.

The present disclosure also provides for a photovoltaic device wherein a cut passes through the first conductor layer, the window layer, the semiconductor layer and the second conductor layer, the cut filled with an insulating material; and wherein the third conductor layer overlaps and contacts a second conductor layer of an adjacent unit cell but does not contact a third conductor layer of the adjacent unit cell.

The present disclosure also provides for a method for fabricating a photovoltaic device including providing a substrate; positioning a first conductor layer on the substrate; positioning a window layer on the first conductor layer; positioning a semiconductor layer on the window layer; printing or adhering dots to the semiconductor layer; positioning a second conductor layer on the semiconductor layer; washing away or removing the dots, thereby removing the second conductive layer in these regions; positioning a pin-hole free polymer film on the second conductor layer; penetrating the polymer film and semiconductor layer in locations centered on the removed dot locations via tunnels of smaller diameter than the dots to expose at least a portion of the first conductor layer; and positioning a third conductor layer on the polymer film, thereby filling the tunnel with the third conductor layer, and with the third conductor layer contacting the first conductor layer via the filled tunnel so that the second and third conductor layers are then available to be accessed in order to utilize power generated by the photovoltaic device.

Any combination or permutation of embodiments is envisioned. Additional advantageous features, functions and applications of the disclosed assemblies, systems and methods of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed systems, assemblies and methods, reference is made to the appended figures, wherein.

DETAILED DESCRIPTION OF DISCLOSURE

Figure 1:
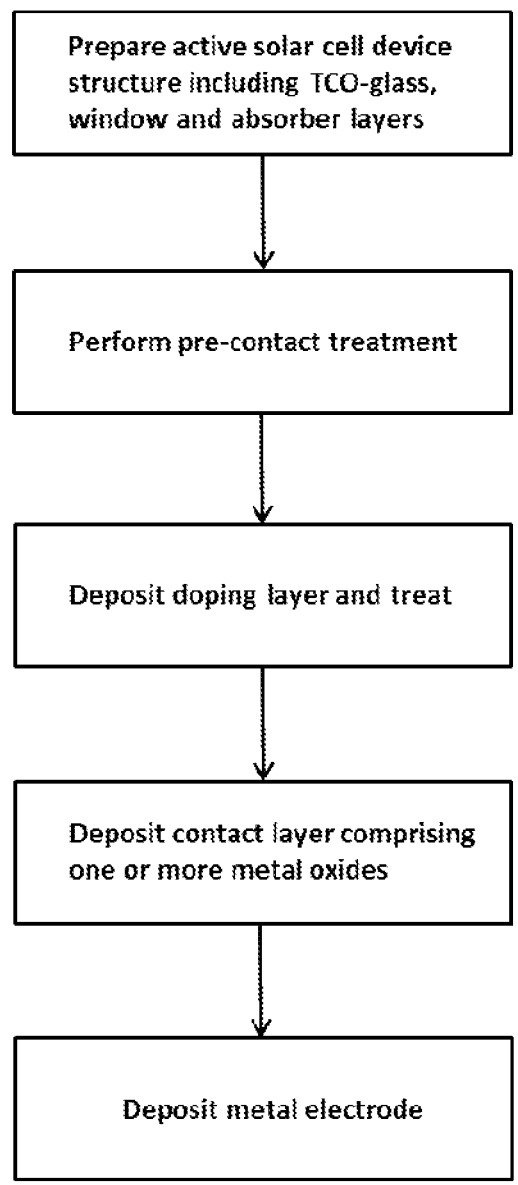
FIG. 1 depicts an exemplary sequence of solar cell fabrication steps in accordance with the present disclosure.

The following is a detailed description of the disclosure provided to aid those skilled in the art in practicing the present disclosure. Those of ordinary skill in the art may make modifications and variations in the embodiments described herein without departing from the scope of the present disclosure. Unless otherwise defined, the technical and scientific terms used herein have the same meaning as commonly understood by one of ordinary skill in the art. The terminology used in the description of the disclosure herein is for describing particular embodiments only, and is not intended to be limiting of the disclosure. All publications, patent applications, patents, figures and other references mentioned herein are expressly incorporated by reference in their entireties.

The exemplary embodiments disclosed herein are illustrative of advantageous photovoltaic devices, and systems of the present disclosure and methods/techniques thereof. It should be understood, however, that the disclosed embodiments are merely exemplary of the present disclosure, which may be embodied in various forms. Therefore, details disclosed herein with reference to exemplary photovoltaic devices/fabrication methods and associated processes/techniques of assembly and use are not to be interpreted as limiting, but merely as the basis for teaching one skilled in the art how to make and use the advantageous photovoltaic devices/systems and/or alternative devices/assemblies of the present disclosure.

The present disclosure provides improved thin film photovoltaic devices/modules and related methods of fabrication. More particularly, the present disclosure provides advantageous CdTe photovoltaic devices/modules and related methods of fabrication.

Disclosed is a novel thin film photovoltaic device and means for its fabrication. In exemplary embodiments, the device includes a metal oxide layer between the absorber layer and the rear electrode, resulting in an ohmic back contact and with the device having improved stability. The metal oxide layer can include at least one of silver oxide or copper oxide, and may also contain one or more of nickel oxide, molybdenum oxide, and/or vanadium oxide.

In exemplary embodiments, the present disclosure is directed towards formation of a ohmic back contact for solar cells, the back contact having improved stability. In certain embodiments, the present disclosure provides for an ohmic contact to p-type II-VI semiconductors (e.g., CdTe semiconductors), and to the fabrication of solar cells having improved stability, and to solar panels incorporating such back contact schemes.

Some objectives of the present disclosure are to provide a reproducible and stable ohmic contact to p-type CdTe (e.g., p-type II-VI CdTe semiconductors), and to control the doping level of the CdTe. The controlled doping and novel ohmic contact are incorporated to form CdTe solar cells with improved stability.

In exemplary embodiments, the systems/methods of the present disclosure utilize one or more metal oxides having a high work function to form an ohmic contact with the p-type CdTe. The use of certain metal oxides or their combination as described herein has not been seen before, and the use of metal oxides alone or in combination is taught away from because metal oxides are usually non-conductive. At least one of copper or silver can also be supplied to the absorber in a very low but controllable concentration through the use of copper oxide or silver oxide. The use of oxides to perform this function has not been utilized previously.

The present disclosure will be further described with respect to the following examples; however, the scope of the disclosure is not limited thereby. The following examples illustrate improved photovoltaic devices/modules and related fabrication/use methods.

Example 1

Figure 2:
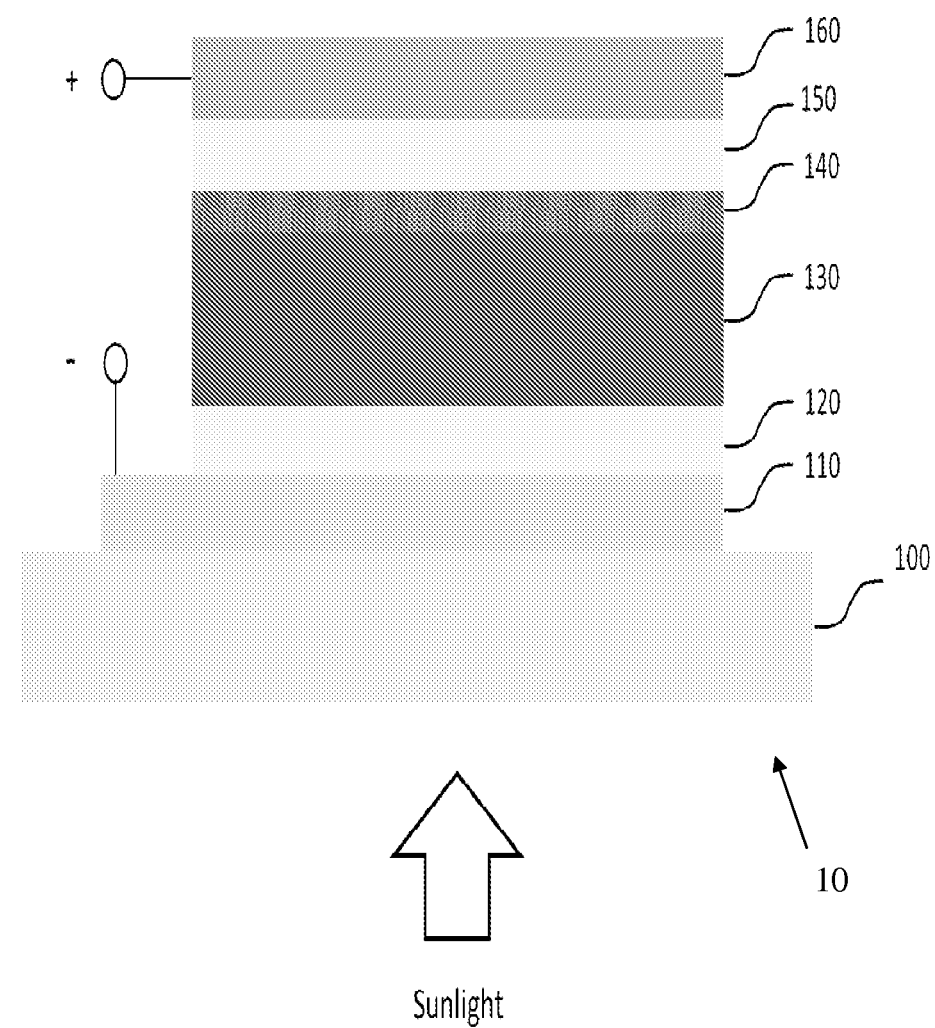
FIG. 2 is a schematic cross-sectional view of an exemplary solar cell structure in accordance with the present disclosure.

In exemplary embodiments of the present disclosure and as shown in FIGS. 1-2, the structure of the active solar cell or photovoltaic device 10 is first formed. For example, the transparent substrate 100 (e.g., glass substrate layer 100) can be coated with a transparent conductor (TCO) 110. The transparent conductor layer 110 can include a transparent conducting oxide overcoated with a high resistive layer, or of other similar such layer performing such function.

A window layer 120 is then positioned on the transparent conductor layer 110. In exemplary embodiments, the window layer 120 can include CdS or oxygenated CdS, and can be deposited by chemical bath deposition, sputtering, or other suitable means/processes.

A semiconductor absorber layer 130 is then positioned on the window layer 120. In certain embodiments, the semiconductor absorber layer 130 includes CdTe, and can be deposited by close-spaced sublimation, vapor transport deposition or other suitable means/processes. These steps are shown grouped together in the first top block of FIG. 1.

Next, the absorber layer 130 is pre-treated to remove the surface oxide and to deplete the surface of Cd. For example, this can be done by nitric-phosphoric (NP) etching, plasma etching or ion etching or the like (FIG. 1, second block from top).

Next, the doping layer 140 (e.g., diffused doping layer 140) that includes copper oxide or silver oxide is deposited and treated (e.g., by annealing) to partially diffuse the doping layer 140 into the absorber layer 130 (FIG. 1, third block from top).

Next, the contact layer 150 (e.g., metal oxide contact layer 150) that includes one or more metal oxides is deposited on the doping layer 140 (FIG. 1, fourth block from top). The preparation and fabrication of the contact layer 150 (e.g., metal oxide contact layer 150) is discussed further below.

Typical metals that have been used to form Schottky barriers on n-type ZnO include those with a high work function, namely Pt (5.1-5.6 eV), Pd (5.2 eV), and Au (5.1 eV). The present disclosure provides that it has recently been discovered that silver oxide forms a Schottky barrier on n-type ZnO with one of the largest barrier heights yet measured on n-type ZnO. This implies that silver oxide should have a large work function. It has also been confirmed that oxidation of silver increases its work function.

An exemplary embodiment of the present disclosure utilizes silver oxide (or copper oxide) as an ohmic contact material, or one component of an ohmic contact material, for a solar cell or photovoltaic device (e.g., for a p-type CdTe solar cell or photovoltaic device). Without being bound to any theory, silver oxide (or copper oxide) has not previously been used in this context.

In general, to serve as a contact, a material should have a finite electrical conductivity. While many stoichiometric metal oxides are highly insulating, the present disclosure provides that silver oxide has sufficient conductivity to serve as a contact material. In such an application, if it is backed by a metallic conductor as described herein, the silver oxide should only have to transport electrical carriers through its thickness and not laterally.

It is noted that silver oxide can be deposited. As noted above, the doping layer 140 (that includes silver oxide or copper oxide) can be deposited and treated (e.g., by annealing) to partially diffuse the doping layer 140 into the absorber layer 130. Moreover and as noted above, the contact layer 150 (e.g., metal oxide contact layer 150) that includes one or more metal oxides is deposited on the doping layer 140.

In exemplary embodiments, silver oxide can be deposited via the deposition of Ag in the presence of atomic oxygen, or in the presence of other forms of reactive or activated oxygen (e.g. ozone). Atomic oxygen can be formed using a discharge (plasma) in a gas that contains oxygen. The gas may also be a mixture containing oxygen, e.g., $Ar$—$O_2$ in an appropriate ratio. In certain embodiments, the Ag can be deposited by evaporation, sputtering, or other suitable methods/processes. It is noted that the silver and atomic oxygen will react on the surface of the substrate to form silver oxide. In exemplary embodiments, the work function of $Ag_2O$ is not less than 5.0 eV.

In certain embodiments, other high work function oxides such as, without limitation, $MoO_3$ (6.8 eV), NiO, CuO, and $V_2O_5$ (7.0 eV) can be mixed with the silver oxide, alone or in combination (or utilized in lieu of the silver oxide). With respect to $MoO_3$, it is noted that $MoO_3$ can conveniently be evaporated directly from the compound, or it can be prepared by reactive sputtering or the like.

In exemplary embodiments, metal-oxide clusters can be prepared by reactive environment hollow cathode sputtering or REHCS (it is noted that gas flow sputtering is a similar exemplary method) at a higher than normal pressure of the inert working gas. Such a preparation method can be used to form metal clusters which will then become oxidized, or fully oxidized clusters are formed directly. The clusters can be formed by atom and particle collisions in the gas phase. In exemplary embodiments, if multiple targets of different composition are used (e.g., Ag and Mo, or Ag and one or more of Cu, V, Ni, Mo), then mixed oxides can be formed. Thus, if it is desired to utilize $V_2O_5$, which in some embodiments may be advantageous but too insulating, it can be mixed with a more conductive metal oxide such as, without limitation, $Ag_2O$, CuO, or $MoO_3$.

An advantage of using a metal oxide contact material is that the high oxide formation energy renders the oxide chemically stable and unlikely to react with either CdTe or other species in its environment. This promotes the long term functionality and stability of the contact.

It is noted that many metals from which such metal oxides are formed are relatively low cost compared with noble metals such as Pt or Au.

In exemplary embodiments, after the deposition of the contact layer 150, the metal layer 160 (e.g., the outer metal electrode layer 160) is then deposited on the contact layer 150 (FIG. 1, bottom block). Metal layer 160 may include multiple layers to provide different functions (e.g., adhesion, diffusion barrier, lateral conductivity, etc., as desired).

In exemplary embodiments, the present disclosure provides for a photovoltaic device 10 having a superstrate configuration.

In certain embodiments and as discussed above, the photovoltaic device 10 includes a transparent substrate 100 (e.g., glass substrate layer 100), a transparent conductor layer 110 (e.g., front transparent conducting electrode layer 110), a window layer 120, an absorber layer 130 (e.g., the absorber layer 130 including a Group II-VI semiconductor), a doping layer 140 (e.g., a treated doping layer 140 including Cu and/or Ag), a contact layer 150 (e.g., a contact layer including one or more metal oxides, such as, for example, at least one of silver oxide or copper oxide), with the contact layer 150 forming an ohmic contact with the absorber layer 130, and a metal layer 160 (e.g., rear metal electrode layer 160) (see FIG. 2).

In certain embodiments, the transparent conductor layer 110 includes a material system selected from: (i) a degenerately doped metal oxide, (ii) a degenerately doped metal oxide overcoated with a high resistance layer, and/or (iii) a silver nanowire net. In one embodiment, the absorber layer 130 includes a CdTe semiconductor. The window layer 120 can include a CdS semiconductor.

In exemplary embodiments, the treated doping layer 140 has largely or substantially diffused into the absorber layer 130, after fabrication. As noted, the contact layer 150 can include at least one of silver oxide and/or copper oxide. Moreover, the contact layer 150 can also include one or more of the following oxides: nickel oxide, molybdenum oxide and/or vanadium oxide.

In exemplary embodiments, it is noted that when the doping layer 140 and/or contact layer 150 includes silver oxide, the silver oxide can include the approximate composition of $Ag_2O$. It is noted that when the doping layer 140 and/or the contact layer 150 includes copper oxide, the copper oxide can include the approximate composition of CuO. It is noted that when the doping layer 140 and/or the contact layer 150 includes nickel oxide, the nickel oxide can include the approximate composition of NiO. It is noted that when the doping layer 140 and/or the contact layer 150 includes molybdenum oxide, the molybdenum oxide can include the approximate composition of $MoO_3$. It is noted that when the doping layer 140 and/or the contact layer 150 includes vanadium oxide, the vanadium oxide can include the approximate composition of $V_2O_5$.

In exemplary embodiments, the silver oxide is deposited by a supply of silver in the presence of an active form of oxygen, by reactive sputtering of silver, and/or by radio frequency (RF) sputtering of silver oxide. For example, the active form of oxygen can be produced by a plasma containing oxygen, or oxygen and one or more other gases (e.g., argon).

In certain embodiments, the $MoO_3$ is deposited by vacuum evaporation of $MoO_3$, or by reactive sputtering of Mo, or by RF sputtering of molybdenum oxide. The reactive sputtering of molybdenum oxide can be based on magnetron sputtering, or on hollow cathode sputtering (e.g., reactive environment hollow cathode sputtering (REHCS), or on gas flow sputtering. In exemplary embodiments, the contact layer 150 is formed by REHCS using different target materials.

In certain embodiments, the rear electrode 160 can include Ni, Ti, Mo, and/or Al. The rear electrode 160 may additionally include one or more underlayers to improve adhesion and/or to prevent impurity diffusion from the outer layer 160.

Example 2

In general, experience has been accumulated in the past few years regarding the installation of large photovoltaic power stations. It has been realized that, when the module voltage is relatively high, e.g. about 90V, then for the common 600 V DC maximum input voltage to the inverter, the number of modules in each series string is typically limited to about 6. This increases the number of strings and the associated quantity of materials required in terms of cables, protecting diodes, and other materials/facilities, thereby increasing the balance-of-system (BOS) cost associated with the power station. If the module voltage is a little under 60V, then about 10 modules can generally be connected in a single string. As such, a trend is towards lower module voltages. For example, the Sharp 235 W monocrystalline silicon module has an even lower open-circuit voltage (Voc) of about 37 V (with a short circuit current or Isc of about 8.5 A), thereby allowing about 15 modules in a single string, and resulting in lower BOS costs. Consequently, it is an objective of the present disclosure to provide for and/or facilitate the fabrication of thin-film modules having lower Vocs than those resulting from the traditional three-scribe interconnection process.

The basic concept for the fabrication of thin-film modules in which the width of the unit cell is not limited by the sheet resistance of the front transparent electrode (transparent conducting oxide) has previously been described (see, e.g., A. E. Delahoy, Energy Conversion Structures, U.S. Pat. No. 4,849,029 (Jul. 18, 1989); and A. E. Delahoy, "Recent Developments in Amorphous Silicon Photovoltaic Research and Manufacturing at Chronar Corporation" Solar Cells 27, 39 (1989)). Such modules can have arbitrarily wide unit cells and correspondingly fewer unit cells per module. This leads in turn to a lower module voltage since unit cells are connected in series. As previously described (see, e.g., A. E. Delahoy, Energy Conversion Structures, U.S. Pat. No. 4,849,029 (Jul. 18, 1989); and A. E. Delahoy, "Recent Developments in Amorphous Silicon Photovoltaic Research and Manufacturing at Chronar Corporation" Solar Cells 27, 39 (1989)) dual metallic layers separated by an insulator allow the fabrication of such modules.

Experience has also shown that the realization by thin film deposition or coating of large area insulating layers (oxides or more generally, dielectrics) designed to insulate a subsequently vacuum-deposited metallic layer from an underlying metallic layer is in practice extremely difficult because of the almost universal occurrence of pinholes. In general, even a single pinhole serves to effectively short the two metallic layers because of the very high conductivity of the layers. This problem has stymied previous attempts to introduce the earlier concepts into manufacturing. Consequently, it is an objective of the present disclosure to realize a highly reliable and manufacturing-friendly method of incorporating the dual metallic layers without encountering shorting problems between the metallic layers.

In exemplary embodiments and as discussed further below, the present disclosure utilizes a foil (e.g., a polymer foil, procured in roll form), to provide a substantially pinhole-free insulating layer, or a pre-metallized polymer foil to provide a substantially pinhole-free insulating layer and rear metallization.

Figure 3:
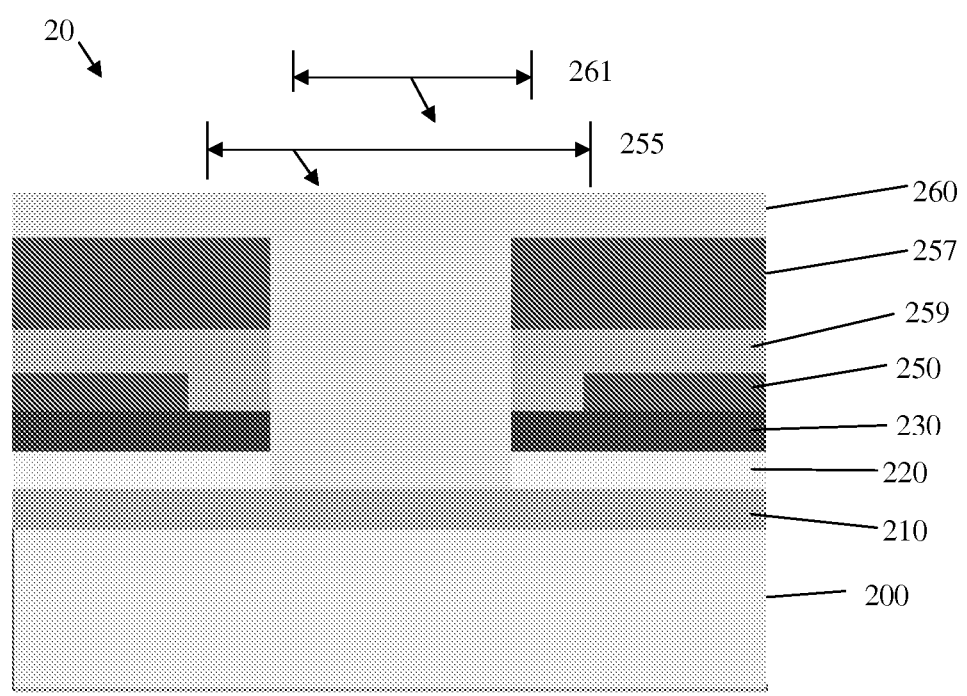
FIG. 3 is a schematic cross-sectional view of another exemplary solar cell structure in accordance with the present disclosure.

In an exemplary embodiment and as shown in FIG. 3, the structure of an active solar cell or photovoltaic device/module 20 is depicted. As shown in FIG. 3, there is a first layer of a transparent conducting contact 210 (e.g., transparent conductor layer 210) on a substrate 200 (e.g., transparent glass substrate layer 200). A window layer 220 is positioned on the transparent conductor layer 210, and the window layer 220 can include CdS or oxygenated CdS. A semiconductor layer 230 is positioned on the window layer 220, and the semiconductor layer 230 can include CdTe.

In this embodiment, there are also one or more layers of an electron-hole pair generation, separation, and transportation (e.g., layers 220, 230). In this embodiment, there is another layer of a conducting contact 250 (e.g., second or back conducting contact layer 250). The embodiment further includes first tunnels 255 penetrating the second conducting contact layer 250 and the layers of electron-hole pair generation and transportation (e.g., layers 220, 230), thereby exposing the first conducting contact layer 210.

In the next step, a layer of a pin-hole-free polymer film 257 is adhered (via adhesion or glue layer 259) to the second conducting contact layer 250, and filling of the first tunnels 255 is accomplished due to the adhesion process (e.g., via glue layer 259 and film layer 257). In this embodiment, tunnels 261 of smaller diameter then penetrate the polymer film 257 and glue layer 259, and the filling layer on the site of the first tunnels 255, thereby exposing the first conducting contact layer 210.

In the next step for this embodiment, a third layer of metal contact 260 (e.g., third contact layer 260) is positioned on the outer surface of the polymer film 257, and continues through the second tunnels 261 to touch and connect to the first conducting contact 210 through the second tunnels 261. The second and third layers of the conducting contact 250, 260 are then electrically connected in order to utilize power generated by the thin film structure.

In a further exemplary embodiment, it is noted that the polymer film 257 can be provided in a pre-metallized state with the third layer of metal contact 260, and additional conducting material or the like can fill the second tunnels 261 thereby connecting the third conducting contact 260 to the first layer 210. In yet a further embodiment of the present disclosure, the polymer film 257 can be provided in an un-metallized state and is metalized after being adhered to the second layer of conducting material 250, and additional conducting material or the like can fill the second tunnels 261 thereby connecting the metallized polymer film 257 to the first layer 210. In exemplary embodiments, the layers of electron-hole pair generation, separation, and transportation consist principally of a junction between CdS and CdTe (e.g., between layers 220, 230).

Figure 4:
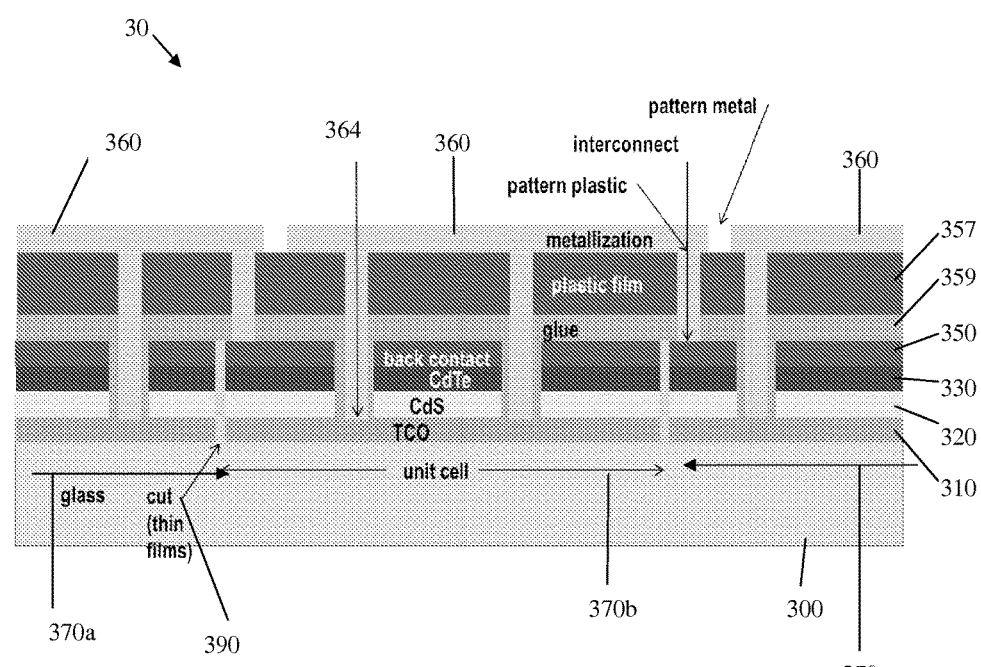
FIG. 4 is a schematic cross-sectional view of another exemplary solar cell structure in accordance with the present disclosure.
Figure 5:
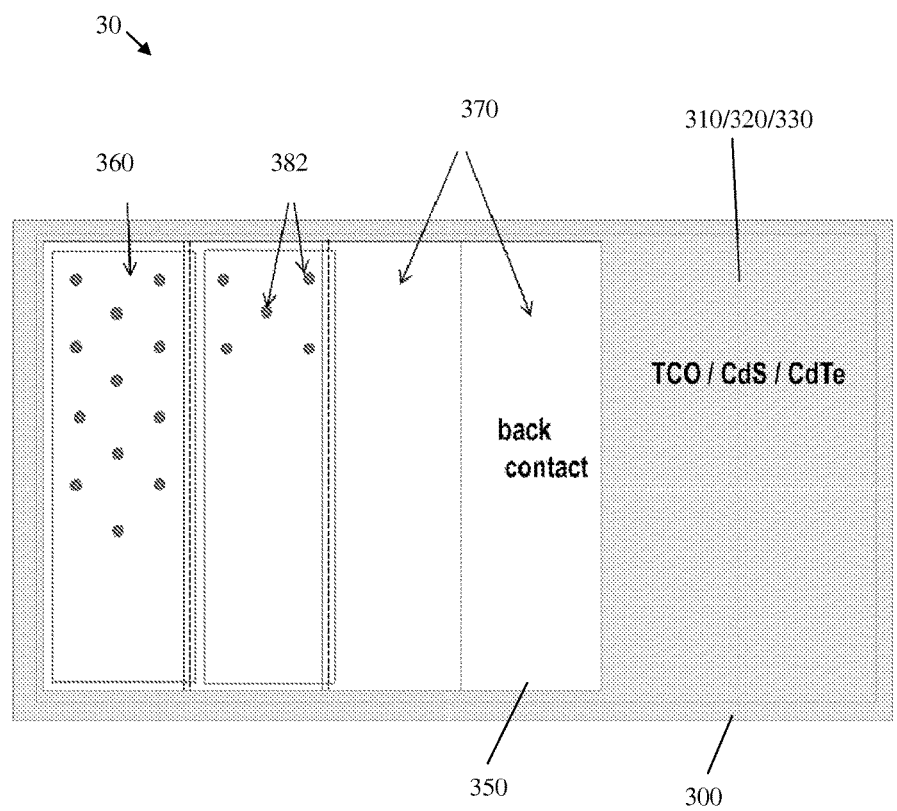
FIG. 5 is a partial top view of the exemplary solar cell structure of FIG. 4.

In another exemplary embodiment and as shown in FIG. 4, the structure of an active solar cell or photovoltaic device/module 30 is depicted. As shown in FIGS. 4-5 and as further discussed below, there is a first layer of a transparent conducting contact 310 (e.g., transparent conductor layer 310) on a substrate 300 (e.g., transparent glass substrate layer 300). A window layer 320 is positioned on the transparent conductor layer 310, and the window layer 320 can include CdS or oxygenated CdS. A semiconductor layer 330 is positioned on the window layer 320, and the semiconductor layer 330 can include CdTe. There is another layer of a conducting contact 350 (e.g., second or back conducting contact layer 350), as discussed further below.

As shown in FIGS. 4-5, the present disclosure provides for a serially-interconnected photovoltaic thin film module 30 consisting of a single substrate 300 bearing multiple unit cells 370 (370a, 370b, 370c, etc.) comprised of the thin film structures described herein, and wherein the unit cells 370 are defined by cuts 390 passing through the first conducting layer 310, the layers of electron-hole pair generation and transportation (e.g., between layers 320, 330), and between the second conducting layer 350, with the cuts 390 being filled by an insulating material. In exemplary embodiments, a third conducting layer 360 of one unit cell (e.g., 370b) overlaps and contacts the second conducting layer 350 of an adjacent unit cell (e.g., 370c), but does not contact the third conducting layer 360 of the adjacent unit cell (e.g., 370c).

In certain embodiments, the photovoltaic thin film structure is made by depositing first layers of conducting transparent oxide contact 310 on a substrate 300, and then depositing layers of semiconductor junction for electron-hole pair generation, separation, and transportation (e.g., layers 320, 330). The layers of the semiconductor junction are then treated.

After treatment, dots 382, providing for a roughly circular metal-free semiconductor region, are printed on or otherwise adhered to the layers of the semiconductor junction (e.g., on layers 320, 330). The next step is to deposit the second layer of conducting contact 350. The use of dots 382 relates to only an exemplary embodiment of the present disclosure utilized for the purpose of achieving roughly circular metal-free semiconductor regions, and other methods known in the art for achieving such result are incorporated in further embodiments of the present disclosure.

This is followed by washing away or otherwise removing the printed dots 382, thereby removing the second conducting contact 350 (and layers 320, 330) and exposing layer 310 in these regions and scribe 390 whole layers into sections. At this stage one layer of pin-hole-free polymer film 357 is adhered (via adhesion of glue layer 359).

At this point, tunnels 364 are formed on the site of the printed dots 382, penetrating the polymer film 357, glue layer 359, second layer of conducting contact 350 and/or the layers of semiconductor junction 320, 330 to expose the first layer of conducting contact 310. In general, the area of the tunnels 364 is smaller than the area of printed dots 382. The next step is to form metal 360 (e.g., third layer of metal contact 360) over the free (un-adhered) surface of the polymer film 357 sufficient to interconnect the exposed portions of the first layer of the conducting contact 310 via the tunnels 364 (e.g., similar to as described above in connection with FIG. 3).

An advantage of module 30 is that no passivation is needed. For example, shunt resistance from metal to device via annulus of CdTe can be calculated as $R=\rho L/A$, $\rho=500$ ohm cm, $L=0.05$ cm, $A=2\pi rt$, $r=0.05$ cm, $t=0.0005$ cm, $R=8E4$ ohm per contact. This is adequately large.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A method for fabricating a photovoltaic device comprising:
   providing a transparent substrate;
   positioning a transparent conductor layer on the transparent substrate;
   positioning a window layer on the transparent conductor layer;
   positioning an absorber layer on the window layer, the absorber layer including a Group II-VI semiconductor;
   positioning a doping layer on the absorber layer, the doping layer including at least one of silver oxide or copper oxide;
   positioning a contact layer on the doping layer, the contact layer: (i) including at least one of silver oxide or copper oxide, and (ii) forming an ohmic contact with the absorber layer; and
   positioning a metal layer on the contact layer;
   wherein the doping layer is substantially diffused into the absorber layer.

2. The method of claim 1, wherein the transparent conductor layer includes a material system selected from the group consisting of a degenerately doped metal oxide, a degenerately doped metal oxide overcoated with a high resistance layer, and a silver nanowire net.

3. The method of claim 1, wherein the absorber layer includes a cadmium telluride semiconductor; and
   wherein the window layer includes a cadmium sulfide semiconductor.

4. The method of claim 1, wherein the contact layer also includes one or more oxides selected from the group consisting of nickel oxide, molybdenum oxide and vanadium oxide.

5. The method of claim 1, wherein the contact layer includes silver oxide; and
   wherein the silver oxide is deposited to the contact layer by a deposition technique selected from the group consisting of: (i) supplying silver in the presence of an active form of oxygen, (ii) by the reactive sputtering of silver, and (iii) by radio frequency (RF) sputtering of silver oxide.

6. The method of claim 1, wherein the contact layer includes silver oxide;
   wherein the silver oxide is deposited to the contact layer by supplying silver in the presence of an active form of oxygen; and
   wherein the active form of oxygen is produced by a plasma containing oxygen or containing oxygen and one or more other gases.

7. The method of claim 1, wherein the contact layer also includes molybdenum oxide; and
   wherein the molybdenum oxide is deposited to the contact layer by a deposition technique selected from the group consisting of: (i) vacuum evaporation of molybdenum trioxide, (ii) reactive sputtering of molybdenum, or (iii) radio frequency sputtering of molybdenum oxide.

8. The method of claim 7, wherein the reactive sputtering of molybdenum is a sputtering technique selected from the group consisting of: (i) magnetron sputtering, (ii) hollow cathode sputtering, (iii) reactive environment hollow cathode sputtering (REHCS), or (iv) gas flow sputtering.

9. The method of claim 1, wherein the contact layer is formed by reactive environment hollow cathode sputtering.

10. The method of claim 1, wherein the metal layer includes at least one of nickel, titanium, molybdenum or aluminum; and
    wherein the metal layer includes one or more underlayers to improve adhesion or to prevent impurity diffusion from the metal layer.

11. A photovoltaic device fabricated according to the method of claim 1.

* * * * *